Dec. 3, 1963 F. S. GOULDING ETAL 3,113,220

GUARD RING SEMICONDUCTOR JUNCTION

Filed Sept. 28, 1960

INVENTORS
FREDERICK S. GOULDING
WILLIAM L. HANSEN
BY

Roland A. Anderson
ATTORNEY 3,113,220
Patented Dec. 3, 1963

1

3,113,220

GUARD RING SEMICONDUCTOR JUNCTION

Frederick S. Goulding, Lafayette, and William L. Hansen, Berkeley, Calif., assignors to the United States of America as represented by the United States Atomic Energy Commission Filed Sept. 28, 1960, Ser. No. 59,131
7 Claims. (Cl. 307—88.5)

Figure 2:
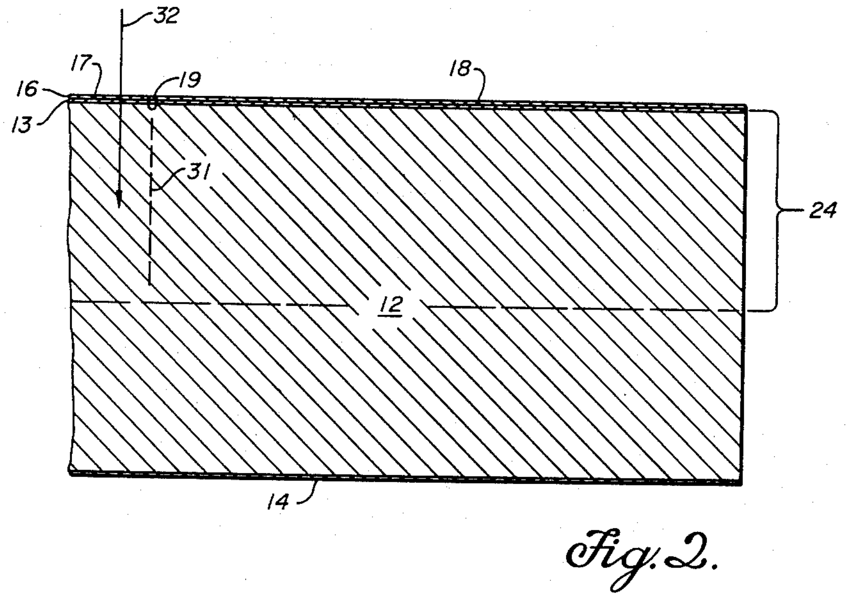

The present invention relates to semiconductor electrical circuit elements and more particularly to an improved semiconductor device having a greatly reduced noise characteristic under reverse biasing conditions.

With the continuing development and refinement of semiconductor devices for electronic applications, the variety and the scope of situations wherein such devices may be advantageously utilized has rapidly increased. The small size and the freedom from heater requirements are obvious advantages of semiconductors over vacuum tubes. However, semiconductors have not as yet provided improved performance over the vacuum tubes when operating with low amplitude signals. The semiconductor noise or fluctuation current masks the desired low amplitude level signals and in this regard the semiconductor performance falls far short of vacuum tube performance.

The unpredictable portion of the semiconductor noise originates at the surface of the semiconductor at the P-N junction from irregular surface currents which flow across the P-N junction, the effect increasing with increased applied voltage under reverse biasing conditions. The irregularities in the surface which disrupt the continuity of the crystalline structure as well as surface contaminants are leading factors in determining the magnitude of the surface currents. The surface current irregularity is most deleterious at low frequencies, the intensity of the surface noise decreasing as frequency increases.

The present invention was originally developed as a semiconductor P-N junction diode for detecting particle radiation from nuclear reactions, however, the invention may be readily applied to other types of P-N junction semiconductor devices such as photosensitive devices and transistors.

The radiation detecting diode is operated under reverse biasing conditions whereby a barrier or depletion layer is created between the P and N regions. It is desirable to have the depletion layer as thick as possible so as to absorb as much energy as possible from an ionizing particle and to reduce the capacitance of the detector to a minimum. A thick depletion layer is produced by applying a high inverse voltage across the diode. However, as previously mentioned, the condition which produces the most surface noise in a semiconductor junction is inverse biasing with a high applied voltage. Thus the problem of noise was particularly troublesome in semiconductor radiation detectors.

In the present invention, the surface current which passes along the surface of the semiconductor between the P and N regions is separated from the signal current through the interior part of the semiconductor by providing a surface current receiving guard ring on the peripheral portion of one surface of the diode. The surface current entering the center region from the encircling guard ring is thereby reduced by a factor of ten to one hundred times, resulting in a large reduction in the noise present in an output taken from the center region.

Of further interest in the usage of semiconductors as radiation detectors is an advantage obtained from the usage of a guard ring wherein the physical limits of the radiation sensitive area has more definite boundaries, thereby increasing the accuracy of pulse height calculations with regard to the energy of detected radiation.

2

Accordingly, it is an object of the present invention to provide a new and improved semiconductor junction.

It is a further object of this invention to provide a new means for reducing noise in the output of a semiconductor device to facilitate the usage of semiconductors for very small signals.

It is a further object of the invention to provide a means for shunting surface currents across a P-N semiconductor junction away from the desired output signals.

It is yet another object of this invention to provide a means for more strictly defining the limits of a radiation sensitive volume at a P–N junction in a semiconductor device.

It is another object of this invention to avoid excessive surface current noise when high inverse voltages are applied to a semiconductor circuit element.

Figure 1:
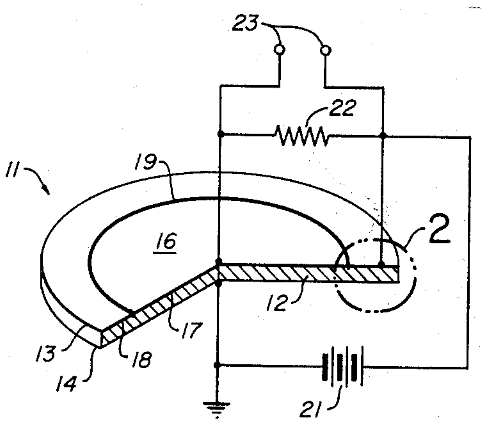

The invention, both as to its organization and method of operation, together with further objects and advantages thereof, will best be understood by reference to the following specification taken in conjunction with the accompanying drawing, in which:

FIGURE 1 is a broken out perspective view showing a novel form of semiconductor junction diode having associated circuitry for operating the diode as an ionizing radiation detector, and FIGURE 2 is an enlarged section view of the portion of FIGURE 1 encircled by line 2 thereon.

Referring now to FIGURES 1 and 2 in conjunction, there is shown a semiconductor diode 11 having a thin flat circular configuration. As shown in FIGURE 2 in particular, all but a small proportion of the diode 11 is an electron acceptor or P-layer 12 and may typically be formed of a five hundred micron thick layer of silicon having a small amount of acceptor impurity therein. To form an electron donor or N-region, a layer 13 of differing material is provided on one surface of the P-layer 12, typically in a thickness of but a fraction of a micron. The N-layer 13 may be produced by phosphorus diffusion into the surface of the P-layer 12. To provide for good electrical contact with the P-layer 12, a layer 14 of suitable non-rectifying conductor material, of which silver is a suitable example, may be plated against the surface of the P-layer opposite the N-layer 13. Similarly a layer 16 of the contact material is plated on the exterior surface of the N-layer 13. Suitable techniques, and other materials, for forming the diode 11 as described up to this point are well understood within the art and may be studied by reference to the text: Handbook of Semiconductor Electronics, by Lloyd P. Hunter, published 1956 by McGraw-Hill Book Company.

Considering now an important feature of the present invention by which means unwanted noise currents may be minimized in the output of a circuit in which the diode is used, the central portion 17 of the N-layer 13 is electrically isolated from the peripheral portion 18 thereof by a circular groove 19. The groove 19 is coaxially situated on the diode, typically having a radius equal to five-eighths of the total radius of the diode, and has a depth sufficient to penetrate completely through contact layer 16, N-layer 13 and preferably to penetrate a short distance into P-layer 12. The electrically isolated peripheral portion 18 of the N-layer 13 will be here termed the guard ring and the utilization of such portion to reduce background noise will be hereinafter described. Considering now one method suitable for fabricating the guard ring structure, a single crystal of high resisitivity P-type material is utilized for the bulk and an N-layer is grown around the surface of the P-region. Part of the N-layer is then etched away in an acid bath. The portions of the N-layer to be retained are covered with an acid resistant substance. In the present invention, the groove 19 is formed by leaving a narrow circular band free from the acid resistant material so that the acid etches out the groove.

Considering now a representative set of circuit connections to the diode, in this instance connections for using the diode as a detector for ionizing radiation, a voltage source 21 has a negative terminal connected to the P-region contact layer 14 and a positive terminal connected to the peripheral or guard ring portion of the N-layer. A load resistor 22 is connected from the positive terminal of the voltage source 21 to the central N-region layer 17. Output signals are developed across the resistor 22 and are made available at a pair of output terminals 23 connected at each side of the resistor 22. While a particular P-N configuration has been described, the P and N regions may be interchanged and, if the applied voltage is reversed, the operation is the same as that to be described.

Considering now the operation of the invention, assume that the voltage source 21 is energized, applying an inverse potential across the semiconductor 11. A depletion or barrier layer 24 is formed at each side of the junction between the P and N layers 12 and 13, extending into each layer from the junction. Nearly the full potential of the voltage source 21 is present across the depletion layer 24, there being little voltage drop across the N and P material outside the depletion layer. In the embodiment of the invention shown, it is preferred that the depletion layer extend into the P-layer for a much greater distance than into the N-layer, such a condition being controlled in the fabrication of the semiconductor by doping the N-layer with impurities much more heavily than the P-layer. It is the depletion layer 24 which is sensitive to ionizing charged particles, each particle releasing electrons and holes in the depletion layer and causing a pulse of current to flow in the external circuit. The pulse current passes through the resistor 22 and causes a voltage pulse which is available across the output terminals 23 for counting and analysis.

Unwanted currents flow from the P-layer 12 to the N-layer 13 over the surface of the depletion layer 24, the current being collected by the guard ring contact layer 13. Thus the deleterious surface currents are bypassed around the resistor 22 and do not cause a voltage to appear at the output terminals 23.

A further consideration which affects the operation is the width of the groove 19. In practice it is found that the width of groove 19 must be a small fraction of the depletion layer depth to obtain minimum surface noise across the terminals 23, in practice the width of the groove 19 being made as small as practical, in the order of 0.001 inch. The probable explanation for the necessity of a narrow groove is that with a broader groove a potential well develops beneath the surface of the groove 19. Fluctuating surface currents in the groove 19 can flow between the central region 17 and the P region 12 and between the guard ring 18 and the P region 12, the two fluctuating currents averaging out to a zero average current between the central N region 17 and the guard ring 18. However, the fluctuation noise is present at the output terminals 23. Reducing the width of the groove 19 to the smallest practical value largely eliminates the fluctuation currents since the potential well is then almost non-existent and there is little tendency for a dipole layer of ionic charge to form on the surface of the groove 19.

The noise originating from the surface of the groove 19 is characterized by increasing amplitude with increase in the applied inverse voltage at low voltages. After some definite inverse voltage level is reached there is no further increase in the noise. As noted above, such surface noise originating from the groove can be practically eliminated by narrowing the groove width.

The electric field lines across the depletion layer 24 are straight and perpendicular to the P-N junction surface except near the outer surface of the depletion layer. Therefore, since electrons follow the field lines, the groove 19 separates the depletion layer 24 into two definite divisions insofar as determining whether released electrons in the depletion layer will move to the central region 17 or the guard ring 18.

Referring now to FIGURE 2 in particular, the depth of the radiation sensitive volume of the semi-conductor is indicated by bracket 24 which volume corresponds to the depletion layer. There is no difference in the response to radiation of the portion of the depletion layer lying directly beneath center N-region 17, and enclosed by dashed lines 31, and the circumferential portion of the depletion layer lying beneath the guard ring N-layer 18, but charge carriers released in the outer portion move to the guard ring 18 and the current therefrom is shunted around the output resistor 22.

In radiation detection work, it is frequently important to know the exact location of the limits of the sensitive volume and such limits should have no curvature. For instance, if the energy of an ionizing particle traveling along line 32 is to be measured, it is important that the particle decay within the depletion region, the number of released charge carriers in the region then being an indication of energy since the further the particle penetrates the depletion layer the greater the number of particles released. The particles will be assumed to be entering the sensitive volume in a direction perpendicular to the surface of the P-N junction. In the present invention the edges of the radiation sensitive region are straight and avoid the possibility of particles passing through the extreme edge of a curved boundary and causing an erroneous indication. That is, an energetic particle could pass through the edge of the sensitive region but be recorded as a fairly low energy particle. Such errors are largely avoided in the present invention, since the electric field lines across the depletion layer in the radiation sensitive region have no curvature. The field lines at the outer edge of the depletion layer will be curved, but the effect thereof is rendered harmless by the separated peripheral N-region 18. Without the separated N-region 18 curved field lines will be present and inaccuracy in radiation measurement will result. As mentioned above, it is frequently desirable to have the radiated particles decay within the depletion layer, thus the depletion layer is made as thick as possible by applying a large inverse voltage. In previous semiconductor particle detectors the inverse voltage has been limited to approximately 50 volts for reliable operation since the surface noise increased at higher potentials. With the present invention, however, much larger inverse voltages of 1000 volts or more can be applied without deleterious surface noise in the output signals. The absence of surface noise not only increases sensitivity to low level signals, but increases the timing accuracy and the accuracy of the pulse height analysis, since the output signal is no longer modulated by noise.

While the invention has been described with regard to a particle detecting diode, it will be apparent that the invention is readily applied to other types of semiconductor diodes and to transistors. Similarly, the invention may be applied to semiconductor diodes inverse to that described in which the P-layer constitutes a thin layer on the N-region. Thus it will be apparent to those skilled in the art that numerous variations and modifications may be made within the spirit and scope of the invention and thus it is not intended to limit the invention except as defined in the following claims:

What is claimed is:

1. In a semiconductor circuit element of the class having a P-region material contacting an N-region material, the combination comprising a base formed of a first of said materials, a layer of the second of said materials disposed against one surface of said base, said second layer being divided into a central region encircled by an electrically separate guard ring region, an impedance connected across said guard ring region and said central region of said second layer, an inverse voltage source directly coupled from said guard ring region of said second layer to said base and coupled to said central region of said layer through said impedance.

2. In a semiconductor circuit element of the class having a P-region material contacting an N-region material, the combination comprising a base formed of a first of said materials, a second layer disposed against said base and being formed of the second of said materials, said second layer having an annular groove therein which groove penetrates through said layer and divides said layer into a peripheral guard ring portion which is electrically separated from the central portion thereof, a load impedance connected from said central portion of said second layer to said guard ring portion thereof, and a power supply having a first terminal connected to said guard ring portion and having a second terminal connected to said base, said first terminal of said power supply being connected to said central portion of said second layer through said impedance.

3. A semiconductor circuit element substantially as described in claim 2 and wherein said groove penetrates through said second layer and a distance into said base.

4. A semiconductor circuit element of the class having a P-region material contacted with an N-region material comprising, in combination, a base formed of a first of said materials and having a first and a second flat surface on opposite sides, a layer formed of the second of said materials and disposed against said first surface of said base, said layer having an annular groove which penetrates through said layer and divides said layer into a central region and an electrically separated circumferential region, a first coating of electrical contact material disposed against said second surface of said base, a second coating of electrical contact material disposed against said central region of said layer, and a third coating of electrical contact material disposed against said circumferential region of said layer, an inverse voltage source connected from said third coating to said first coating, and an impedance connected from said third coating to said second coating.

5. A semiconductor radiation detector of the class having a P-region material contacted with an N-region material comprising, in combination a base disc formed of a first of said materials and having a flat surface thereon, a layer of said second material disposed on said surface of said base disc which layer is thin relative to the thickness of said base disc and which contains more impurity than said base disc, said layer having an annular groove therein which penetrates said layer and which divides said layer into a central region and a peripheral region electrically separated from said central region, a first conductive contact disposed against said base disc opposite said layer thereon, a second conductive contact disposed against said central region of said layer, a third conductive contact disposed against said peripheral region of said layer, a voltage source applying a high potential difference between said first contact and said third contact, an impedance connected between said second contact and said third contact, and a pair of signal output terminals one connected with said second contact and one connected with said third contact.

6. In a semiconductor circuit element, the combination comprising a P material base having a flat surface thereon, an N material layer disposed in contact with said surface of said P material base, said N-material layer being divided into a central region and an electrically separate peripheral region, a voltage source having a positive voltage terminal connected to said N material layer peripheral region and having a negative terminal connected to said P-material base, an impedance connected between said central region of said N-material layer and said positive voltage terminal, and a pair of output terminals each connected to an opposite end of said impedance.

7. In a semiconductor circuit element, the combination comprising an N-material base having a flat surface thereon, a P-material layer disposed in contact with said surface of said N-material base, said P-material layer being divided into a central region and an electrically separate peripheral region, a voltage source having a negative voltage terminal connected to said P-material peripheral region and having a positive voltage terminal connected to said N-material base, an impedance coupled between said central region of said P-material layer and said negative voltage terminal, and a pair of output terminals each connected to an opposite end of said impedance.

References Cited in the file of this patent

UNITED STATES PATENTS

| | | |
|---|---|---|
| 2,629,800 | Pearson | Feb. 24, 1953 |
| 2,672,528 | Shockley | Mar. 16, 1954 |
| 2,885,562 | Marinace et al. | May 5, 1959 |
| 2,998,534 | Pomerantz | Aug. 29, 1961 |